US010354919B2

(12) United States Patent
Tabuchi et al.

(10) Patent No.: US 10,354,919 B2
(45) Date of Patent: Jul. 16, 2019

(54) WAFER DIVIDING METHOD

(71) Applicant: DISCO CORPORATION, Tokyo (JP)

(72) Inventors: Tomotaka Tabuchi, Tokyo (JP);
Kentaro Odanaka, Tokyo (JP); Satoshi
Kumazawa, Tokyo (JP); Senichi Ryo,
Tokyo (JP); Yuki Ogawa, Tokyo (JP)

(73) Assignee: DISCO CORPORATION, Tokyo (JP)

( * ) Notice: Subject to any disclaimer, the term of this
patent is extended or adjusted under 35
U.S.C. 154(b) by 0 days.

(21) Appl. No.: 15/348,071

(22) Filed: Nov. 10, 2016

(65) Prior Publication Data
US 2017/0140989 A1 May 18, 2017

(30) Foreign Application Priority Data
Nov. 16, 2015 (JP) ................ 2015-223723

(51) Int. Cl.
H01L 21/44 (2006.01)
H01L 21/78 (2006.01)
B05D 1/00 (2006.01)
B05D 3/06 (2006.01)
H01L 21/268 (2006.01)
H01L 21/306 (2006.01)
H01L 21/67 (2006.01)

(52) U.S. Cl.
CPC ............ H01L 21/78 (2013.01); B05D 1/005
(2013.01); B05D 3/06 (2013.01); H01L
21/268 (2013.01); H01L 21/30604 (2013.01);
H01L 21/67092 (2013.01)

(58) Field of Classification Search
CPC ............ H01L 21/78; H01L 21/67207; H01L
21/30655; H01L 21/6836; H01L
2221/68327; H01L 21/3065; B23K
26/364
See application file for complete search history.

(56) References Cited

U.S. PATENT DOCUMENTS 6,117,347 A * 9/2000 Ishida ................ H01L 21/3043
216/17
6,420,245 B1 * 7/2002 Manor ............... B23K 26/0093
257/E21.599
(Continued)

FOREIGN PATENT DOCUMENTS

JP 2006-190779 7/2006
JP 2007-069249 3/2007

Primary Examiner — Bradley Smith
Assistant Examiner — David J Goodwin
(74) Attorney, Agent, or Firm — Greer Burns & Crain,
Ltd.

(57) ABSTRACT

A method for dividing a wafer having a wiring layer
including Cu on the front side, the front side of the wafer
being partitioned by a plurality of crossing division lines to
define a plurality of separate regions where a plurality of
devices are formed. The method includes a laser processed
groove forming step of applying a laser beam to the wiring
layer along each division line to thereby remove the wiring
layer along each division line and form a laser processed
groove along each division line, a cutting step of using a
cutting blade having a thickness smaller than the width of
each laser processed groove to fully cut the wafer along each
laser processed groove after performing the laser processed
groove forming step, and a dry etching step of dry-etching
at least each laser processed groove after performing the
laser processed groove forming step.

3 Claims, 9 Drawing Sheets

(56) References Cited

U.S. PATENT DOCUMENTS

| | | | | |
|---|---|---|---|---|
| 6,596,562 | B1* | 7/2003 | Maiz | H01L 21/3043 257/E21.238 |
| 8,598,016 | B2* | 12/2013 | Yalamanchili | H01L 21/30655 257/E21.602 |
| 8,993,414 | B2* | 3/2015 | Eaton | H01L 21/78 438/465 |
| 9,355,907 | B1* | 5/2016 | Lei | H01L 21/82 |
| 2003/0124771 | A1* | 7/2003 | Maiz | H01L 21/3043 438/113 |
| 2003/0173333 | A1* | 9/2003 | Wang | H01J 37/321 216/67 |
| 2005/0101108 | A1* | 5/2005 | Genda | H01L 21/67092 438/462 |
| 2005/0139962 | A1* | 6/2005 | Dani | H01L 21/78 257/620 |
| 2006/0189099 | A1* | 8/2006 | Lu | H01L 21/78 438/460 |
| 2007/0028943 | A1* | 2/2007 | Sawin | B08B 7/0035 134/1.1 |
| 2009/0191690 | A1* | 7/2009 | Boyle | H01L 21/78 438/462 |
| 2012/0322234 | A1* | 12/2012 | Yalamanchili | H01L 21/30655 438/462 |
| 2012/0329246 | A1* | 12/2012 | Finn | H01L 21/67207 438/462 |
| 2014/0099777 | A1* | 4/2014 | Mackh | H01L 21/78 438/463 |
| 2015/0214109 | A1* | 7/2015 | Lei | H01L 21/78 438/462 |

* cited by examiner

WAFER DIVIDING METHOD

BACKGROUND OF THE INVENTION

Field of the Invention

The present invention relates to a wafer dividing method for dividing a wafer into individual device chips.

Description of the Related Art

A plurality of devices such as integrated circuits (ICs) and large scale integrations (LSIs) are formed on the front side of a wafer so as to be separated from each other by a plurality of crossing division lines. The wafer thus having the plural devices on the front side is divided (cut) into individual device chips by a cutting apparatus having a rotatable cutting blade, for example. The device chips are used in various electronic equipment such as mobile phones and personal computers. As a method of dividing such a wafer, there is a dividing method including the steps of applying a laser beam to the wafer to thereby form a laser processed groove along each division line on the front side of the wafer, and next using a cutting blade to fully cut the wafer along each laser processed groove. As the wafer to be divided by the above dividing method, there is a wafer composed of a semiconductor substrate such as a silicon substrate and a wiring layer formed on the front side of the semiconductor substrate, the wiring layer including copper (Cu). This wiring layer is formed so as to constitute not only the devices, but also the division lines formed on the front side of the wafer. Accordingly, when the wiring layer is cut by a cutting blade, there arises a problem such that Cu included in the wiring layer may adhere to the cutting blade.

To cope with this problem, a laser beam is first applied to the front side of the wafer along each division line to thereby cut and remove a part of the wiring layer including Cu along each division line by ablation. Accordingly, a laser processed groove having a depth reaching the silicon substrate is formed on the front side of the wafer along each division line. Thereafter, the wafer is fully cut along each laser processed groove by using a cutting blade (see Japanese Patent Laid-open No. 2006-190779, for example). In this dividing method, each laser processed groove has a width greater than the thickness of the cutting blade and less than the width of each division line. By using the cutting blade to cut the wafer along each laser processed groove, the adhesion of Cu included in the wiring layer to the cutting blade can be prevented.

However, in forming each laser processed groove, Cu included in the wiring layer may be melted by the application of the laser beam, and a part of the melted Cu may become debris adhering to the side walls and bottom of each laser processed groove. To remove this debris including Cu, there has been proposed a laser processing apparatus including a processing nozzle capable of removing the debris during processing (see Japanese Patent Laid-open No. 2007-069249, for example).

SUMMARY OF THE INVENTION

Even by using the laser processing apparatus as described in Japanese Patent Laid-open No. 2007-069249, it is difficult to completely remove debris including powder Cu adhering to the inner surface of each laser processed groove. However, as far as the debris including Cu is present in each laser processed groove, it has been considered that the debris has no effect on each device and that it is therefore unnecessary to completely remove the debris present in each laser processed groove.

However, it has been found that the debris including Cu may react with silicon and moisture in the air. More specifically, the debris including Cu comes into contact with the silicon substrate exposed to each laser processed groove, so that $Cu_3Si$ as a seed is formed on the side walls and bottom of each laser processed groove. Thereafter, $Cu_3Si$ reacts with moisture in the air to form a layer composed of $Cu_2O$ and Cu on the surface of $Cu_3Si$. Further, a layer of $SiO_2$ is formed on the layer composed of $Cu_2O$ and Cu, so that the debris is gradually enlarged. As a result, there is a possibility that the debris enlarged on the side walls of each laser processed groove (the side walls formed of the silicon substrate exposed to each laser processed groove) may come into contact with the wiring layer, so that there is a problem in each device chip obtained by dividing the wafer having such enlarged debris coming into contact with the wiring layer. That is, wiring in each device may be short-circuited to cause damage.

The Cu itself adhering to the silicon substrate cannot be removed by cleaning with a cleaning water or dry etching. Accordingly, cleaning with chemicals or wet etching is required for the removal of the Cu from the silicon substrate and it is therefore difficult to remove the Cu. In particular, the debris enlarged on the side walls of the silicon substrate exposed to each laser processed groove is left as it is even after ending the cutting operation by the cutting blade, because the width of each laser processed groove is greater than the thickness of the cutting blade. Accordingly, there is a high possibility that the debris enlarged may continue to grow.

It is therefore an object of the present invention to provide a wafer dividing method which can suppress the growth of the debris including Cu in each laser processed groove to thereby eliminate the possibility that the debris may come into contact with the wiring layer of each device chip obtained by dividing the wafer.

In accordance with an aspect of the present invention, there is provided a wafer dividing method for dividing a wafer having a wiring layer including Cu on the front side, the front side of the wafer being partitioned by a plurality of crossing division lines to define a plurality of separate regions where a plurality of devices are formed, the wafer dividing method including a laser processed groove forming step of applying a laser beam having an absorption wavelength to the wafer, to the wiring layer along each division line to thereby remove the wiring layer along each division line and form a laser processed groove along each division line; a dry etching step of dry-etching at least each laser processed groove after performing the laser processed groove forming step; and a cutting step of using a cutting blade having a thickness smaller than the width of each laser processed groove to fully cut the wafer along each laser processed groove after performing the laser processed groove forming step.

Preferably, the wafer dividing method further includes a protective film forming step of forming a protective film for protecting the front side of each device, before performing the dry etching step.

As described above, the wafer dividing method according to the present invention includes the dry etching step of dry-etching at least each laser processed groove after performing the laser processed groove forming step. Accordingly, a silicon substrate constituting the wafer is dry-etched in an area where debris including Cu adheres, thereby allowing the removal of the debris including Cu from the silicon substrate. As a result, the growth of the debris including Cu in each laser processed groove can be suppressed to thereby eliminate the possibility that the debris may come into contact with the wiring layer of each device chip obtained by dividing the wafer.

Further, the protective film forming step of forming a protective film for protecting the front side of each device is performed before performing the dry etching step. Accordingly, an adverse effect on the front side of each device in the dry etching step can be further reduced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
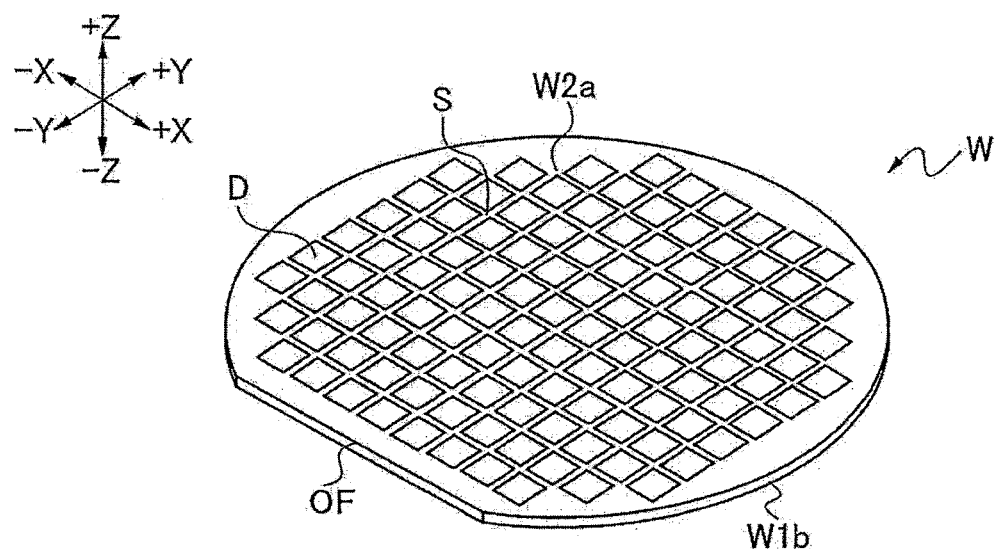
FIG. 1 is a perspective view of a wafer to be divided by the wafer dividing method according to the present invention.

A preferred embodiment of the wafer dividing method according to the present invention will now be described with reference to the drawings. FIG. 1 shows a wafer W to be divided by the wafer dividing method according to this preferred embodiment. The wafer W shown in FIG. 1 has a substantially circular outside shape with an orientation flat OF indicating a crystal orientation. The orientation flat OF of the wafer W is formed by flat cutting a part of the outer circumference of a circular wafer. The wafer W has a front side (upper surface) W2a and a back side (lower surface) W1b. The front side W2a of the wafer W is partitioned into a plurality of rectangular regions by a plurality of crossing division lines (streets) S, wherein a device D such as IC is formed in each rectangular region.

Figure 2:
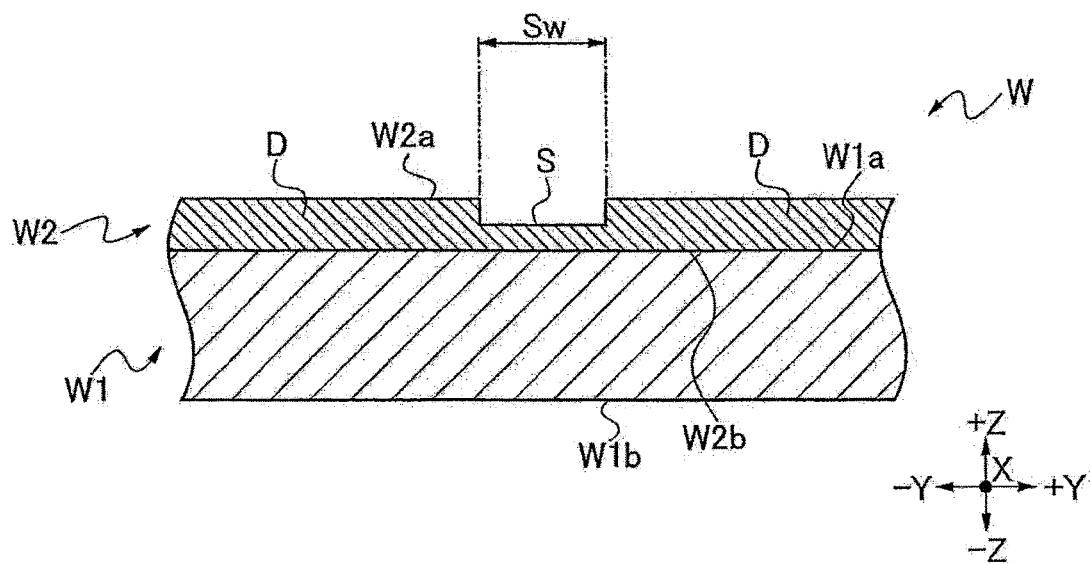
FIG. 2 is an enlarged sectional view of an essential part of the wafer, showing a layer structure.

As shown in FIG. 2, the wafer W has a layer structure composed of a substrate W1 and a wiring layer W2 formed on the substrate W1. The substrate W1 has a front side (upper surface) W1a and a back side (lower surface) W1b. The wiring layer W2 has a front side (upper surface) W2a and a back side (lower surface) W2b. The wiring layer W2 is formed on the upper surface W1a of the substrate W1. The substrate W1 is formed of silicon (Si). That is, the substrate W1 is a silicon substrate. The wiring layer W2 includes at least copper (Cu). The upper surface W2a of the wiring layer W2 is identical with the front side of the wafer W. The lower surface W1b of the substrate W1 is identical with the back side of the wafer W. Each street S has a width Sw, and it is formed as a groove having a depth from the front side W2a of the wafer W (the upper surface W2a of the wiring layer W2) to an intermediate position in the thickness direction (Z direction) of the wiring layer W2.

(1) Protective Film Forming Step

In performing the wafer dividing method according to this preferred embodiment, a protective film forming step is first performed in such a manner that a protective film W3 (see FIG. 4) is formed on the front side W2a of the wafer W in order to protect the front side (upper surface) of each device D.

Figure 3:
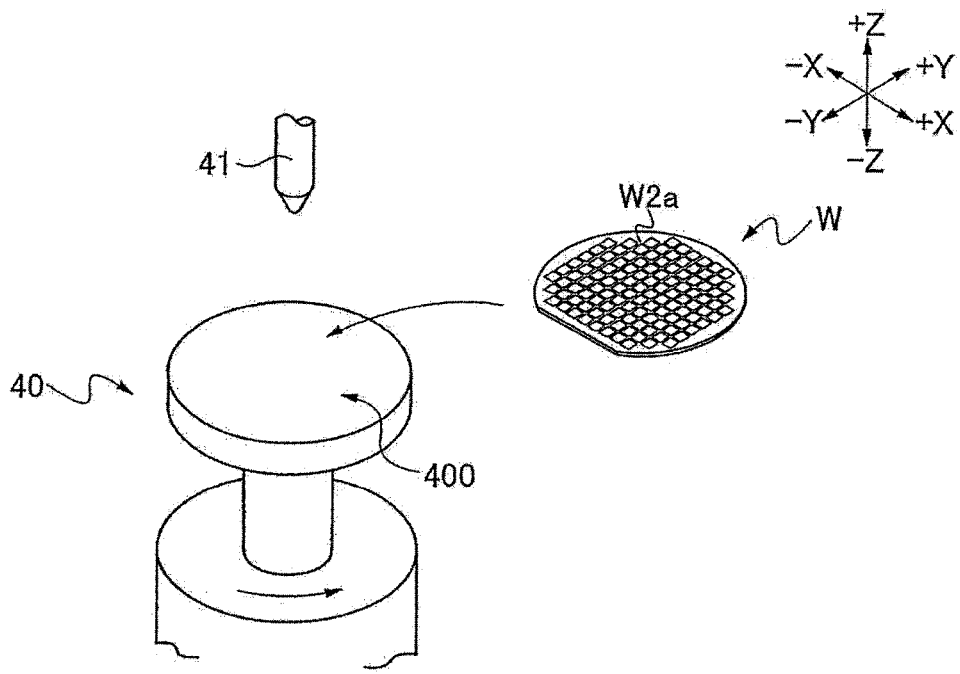
FIG. 3 is a perspective view showing a condition that the wafer is transferred to a spin coater in a protective film forming step.
Figure 4:
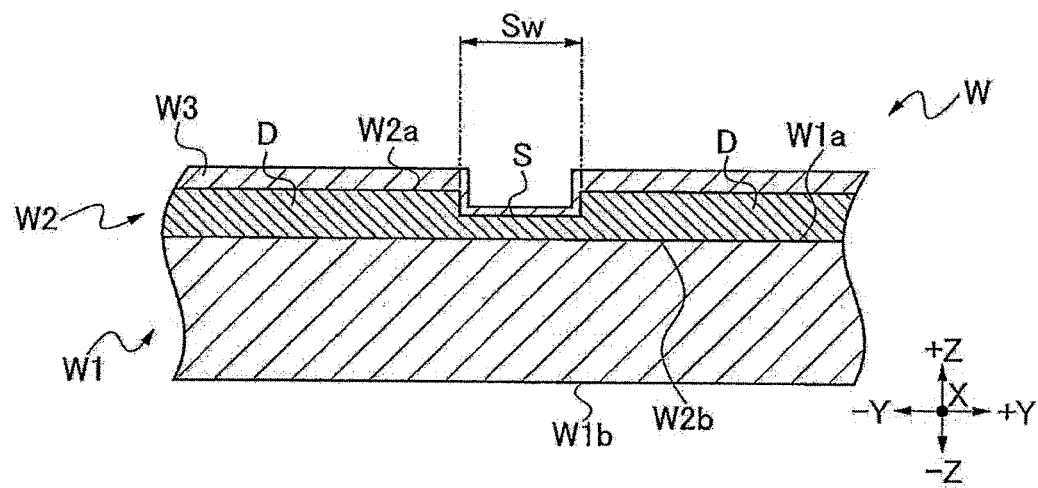
FIG. 4 is an enlarged sectional view of an essential part of the wafer processed by the protective film forming step.

In this protective film forming step, the wafer W is placed on a rotatable spinner table 400 of a spin coater 40 shown in FIG. 3 in the condition where the front side W2a is exposed. Suction means (not shown) connected to the spin coater 40 is next operated to hold the wafer W on the spinner table 400 under suction. Thereafter, a predetermined amount of protective film material (e.g., water-soluble resin) in a liquid state is dropped from a protective film material nozzle 41 to the center of the front side W2a of the wafer W held on the spinner table 400 under suction. Thereafter, the spinner table 400 is rotated at a predetermined speed, so that the protective film material dropped to the center of the front side W2a of the wafer W flows radially outward to the outer circumference of the wafer W due to a centrifugal force. Accordingly, the protective film material is leveled on the whole surface of the front side W2a of the wafer W. Thereafter, the protective film material in the liquid state on the front side W2a of the wafer W is dried to form the protective film W3 having a substantially uniform thickness on the front side W2a of the wafer W as shown in FIG. 4. When a laser processed groove M is formed in a laser processed groove forming step to be hereinafter described (see FIG. 8), the protective film W3 formed along each street S is partially removed by the laser processed groove M.

(2) Laser Processed Groove Forming Step

Figure 8:
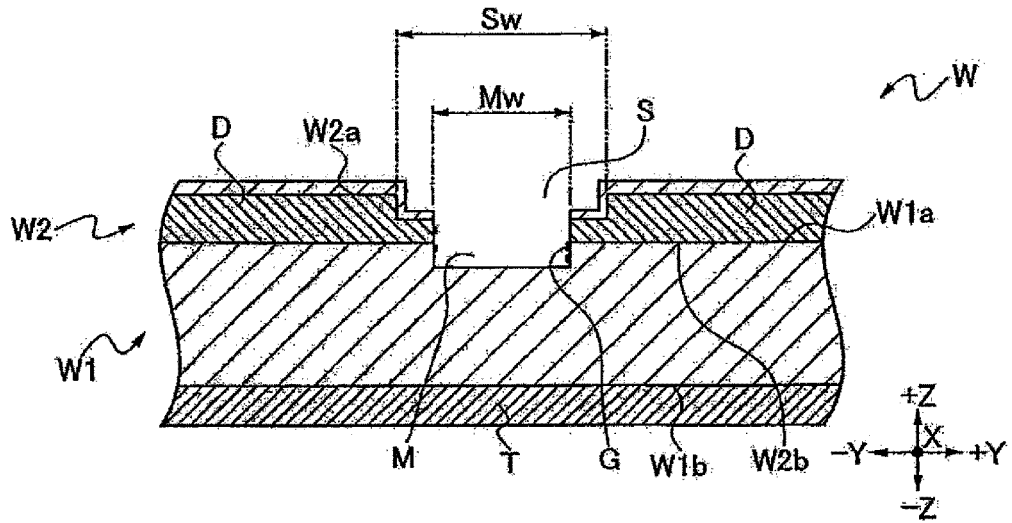
FIG. 8 is an enlarged sectional view of an essential part of the wafer in the condition where a laser processed groove has been formed along each division line after performing the step shown in FIG. 7, showing the adhesion of debris including Cu to the side walls of the laser processed groove.

After performing the protective film forming step, a laser processed groove forming step is performed in such a manner that a laser beam having an absorption wavelength to the wafer W is applied to the wiring layer W2 along each street S to thereby remove the wiring layer W2 along each street S and form a laser processed groove M along each street S (see FIG. 8).

Figure 5:
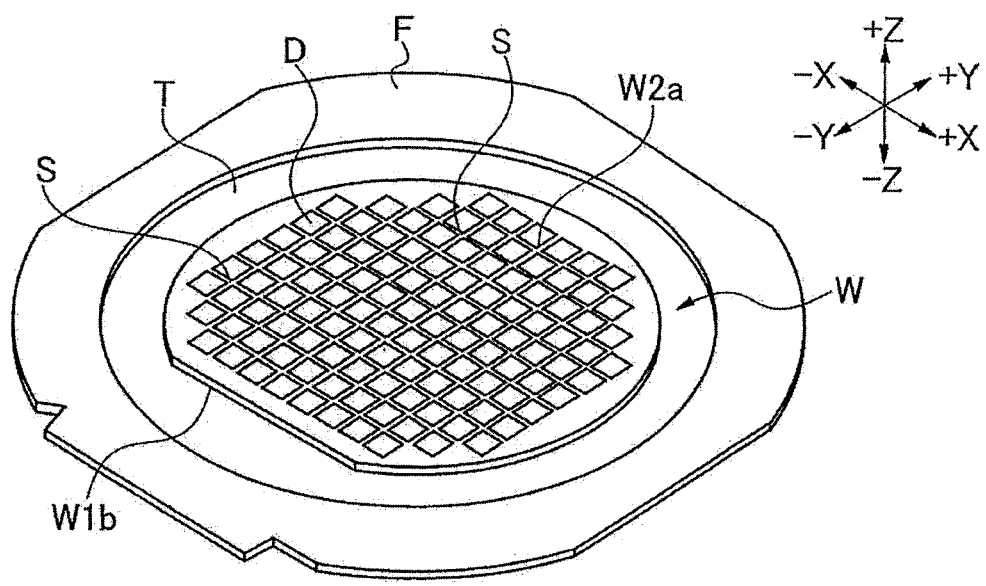
FIG. 5 is a perspective view of the wafer supported through an adhesive tape to a ring frame.

Prior to performing the laser processed groove forming step, the wafer W is attached to an adhesive tape T supported to a ring frame F in the condition where the front side W2a is exposed as shown in FIG. 5. Thereafter, the wafer W supported through the adhesive tape T to the ring frame F is carried and held on a chuck table 11 of a laser processing apparatus 1 shown in FIG. 6.

Figure 6:
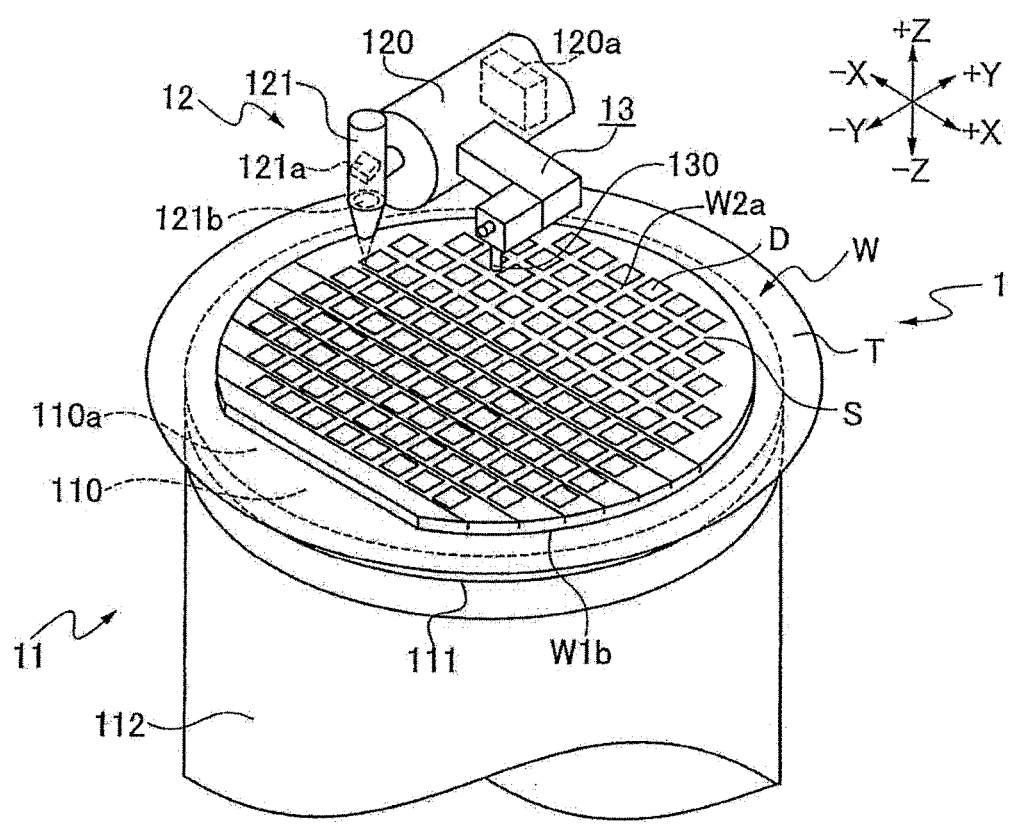
FIG. 6 is a perspective view showing a condition that a laser beam is applied to the wiring layer of the wafer along each division line in a laser processed groove forming step.

As shown in FIG. 6, the laser processing apparatus 1 to be used in performing the laser processed groove forming step essentially includes the chuck table 11 for holding the wafer W, laser beam applying means 12 for applying a laser beam having an absorption wavelength to the wafer W held on the chuck table 11, and alignment means 13 for detecting each street S where the laser processed groove M (see FIG. 8) is to be formed, on the wafer W held on the chuck table 11.

The chuck table 11 has a circular outside shape and it includes a suction holding portion 110 for holding the wafer W under suction and a frame portion 111 for supporting the suction holding portion 110. The suction holding portion 110 is in communication with a vacuum source (not shown). The suction holding portion 110 has an exposed surface (upper surface) as a holding surface 110a for holding the wafer W thereon under suction. The chuck table 11 is movable back and forth in the X direction. Further, the chuck table 11 is rotationally driven by rotating means 112 provided below the chuck table 11.

The laser beam applying means 12 is movable back and forth in the Y direction and the Z direction. The laser beam applying means 12 includes a cylindrical housing 120 provided above the chuck table 11 so as to extend in a horizontal direction. A laser oscillator 120a is provided in the housing 120 to oscillate a laser beam. Focusing means 121 is mounted on the front end of the housing 120 to focus the laser beam oscillated by the laser oscillator 120a. The focusing means 121 includes a mirror 121a for reflecting the laser beam oscillated by the laser oscillator 120a and a focusing lens 121b for focusing the laser beam reflected by the mirror 121a. Accordingly, the laser beam focused by the focusing lens 121b can be scanned in an arbitrary direction in a plane parallel to the front side W2a of the wafer W.

The alignment means 13 includes imaging means 130 for imaging the front side W2a of the wafer W. Accordingly, each street S where the laser processed groove M is to be formed on the wafer W can be detected according to an image obtained by the imaging means 130. The alignment means 13 and the laser beam applying means 12 are united together, so that they are movable together in the Y direction and the Z direction.

In holding the wafer W on the chuck table 11 under suction, the back side W1b of the wafer W is so positioned as to face the holding surface 110a of the chuck table 11 shown in FIG. 6. Thereafter, the wafer W supported through the adhesive tape T to the ring frame F is placed on the chuck table 11. In this condition, the vacuum source (not shown) connected to the chuck table 11 is operated to produce a suction force, which is transmitted to the holding surface 110a of the chuck table 11, thereby holding the wafer W on the chuck table 11 under suction in the condition where the wiring layer W2 is oriented upward. In FIG. 6, the ring frame F is not shown.

Thereafter, the wafer W held on the chuck table 11 is moved in the −X direction (forward direction). During this movement, each street S is detected by the alignment means 13. More specifically, each street S is imaged by the imaging means 130, and image processing such as pattern matching is performed by the alignment means 13 according to an image of each street S obtained by the imaging means 130. Thusly, the position of each street S is detected.

In association with this detection of each street S, the laser beam applying means 12 is moved in the Y direction to position the focusing means 121 with respect to a predetermined one of the streets S extending in a first direction. That is, the focusing means 121 is positioned with respect to the predetermined street S in the Y direction. This positioning is performed so that the optical axis of the focusing lens 121b included in the focusing means 121 is deviated from the center line of the predetermined street S in its lateral direction (−Y direction).

In the laser beam applying means 12, the laser oscillator 120a is operated to oscillate a laser beam having an absorption wavelength to the wafer W. The laser beam oscillated from the laser oscillator 120a is reflected by the mirror 121a to enter the focusing lens 121b. The focusing lens 121b is adjusted in height so that the focal point of the laser beam is set at a vertical position slightly below the upper surface W1a of the substrate W1 in its thickness direction (Z direction) as viewed in FIG. 4. Accordingly, the laser beam focused by the focusing lens 121b is applied to the wiring layer W2 of the wafer W with a predetermined focused spot diameter M1w (the width of a laser processed groove M1 to be formed) shown in FIG. 7.

Figure 7:
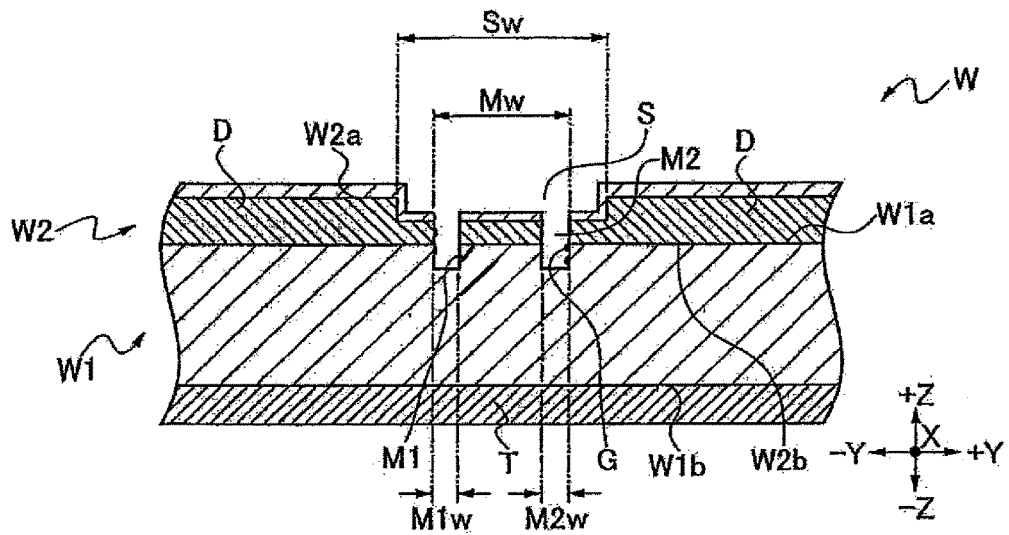
FIG. 7 is an enlarged sectional view of an essential part of the wafer in the condition where two laser processed grooves have been formed along each division line in the laser processed groove forming step.

Further, the wafer W is fed in the −X direction at a predetermined speed as applying the laser beam to the wafer W, thereby performing ablation to the wafer W along the predetermined street S. As a result, the laser processed groove M1 is formed along the predetermined street S to thereby remove the wiring layer W2 and the protective film W3 in an area corresponding to the laser processed groove M1 as shown in FIG. 7. When the wafer W is fed in the −X direction to reach a predetermined position where the application of the laser beam is stopped, the feeding of the wafer W in the −X direction (forward direction) is once stopped. As a result, the laser processed groove M1 having the width M1w and a depth greater than the thickness of the wiring layer W2 is formed along the predetermined street S of the wafer W as shown in FIG. 7.

Thereafter, the focusing means 121 is moved in the +Y direction to thereby move the optical axis of the focusing lens 121b of the focusing means 121 to a position deviated from the center line of the predetermined street S toward the +Y side opposite to the laser processed groove M1. Thereafter, the laser beam is applied to the wiring layer M2 of the wafer W with a predetermined focused spot diameter M2w (the width of a laser processed groove M2 to be formed) shown in FIG. 7. Further, the wafer W is fed in the +X direction (backward direction) at a predetermined speed as applying the laser beam to the wafer W, thereby performing ablation to the wafer W along the predetermined street S. As a result, the laser processed groove M2 is formed along the predetermined street S to thereby remove the wiring layer W2 and the protective film W3 in an area corresponding to the laser processed groove M2 as shown in FIG. 7. Accordingly, the two laser processed grooves M1 and M2 are formed on both sides of the center line of the predetermined street S. Both of the two laser processed grooves M1 and M2 are formed in the range of the width Sw of the predetermined street S.

Thereafter, the focusing means 121 shown in FIG. 6 is moved in the +Y direction to a position directly above the next street S adjacent to the predetermined street S where the two laser processed grooves M1 and M2 have been formed as mentioned above. Thereafter, the focusing means 121 is positioned with respect to the center line of this next street S in the Y direction in a manner similar to that mentioned above. Thereafter, the laser beam is applied to the wafer W as feeding the wafer W in the forward direction and the backward direction to thereby similarly form two laser processed grooves M1 and M2 along this next street S. Thus, this laser processing is similarly performed along all of the other streets S extending in the first direction to similarly form two laser processed grooves M1 and M2 along each street S extending in the first direction. Thereafter, the chuck table 11 is rotated 90 degrees to similarly perform this laser processing along all of the other streets S extending in a second direction perpendicular to the first direction to similarly form two laser processed grooves M1 and M2 along each street S extending in the second direction. In FIG. 7, reference symbol Mw denotes the distance between the outer side wall of the laser processed groove M1 on the −Y side and the outer side wall of the laser processed groove M2 on the +Y side.

Thereafter, the optical axis of the focusing lens 121b of the focusing means 121 is moved in the Y direction to a position on the center line of the predetermined street S. In this condition, the laser beam is changed to a wide beam having a predetermined focused spot diameter (e.g., a diameter not greater than the width Mw of the laser processed groove M to be formed). Thereafter, this wide beam is applied to the wafer W along the predetermined street S as feeding the wafer W in the −X direction (forward direction). As a result, the wiring layer W2 left between the two laser processed grooves M1 and M2 is removed together with the protective film W3 by ablation, thereby forming the laser processed groove M having the width Mw as shown in FIG. 8. Accordingly, the wiring layer W2 formed on the substrate W1 is divided by the laser processed groove M. Further, a part of the wiring layer W2 melted by the application of the laser beam adheres to the side walls of the laser processed groove M. This melted part of the wiring layer W2 becomes debris G including Cu as shown in FIG. 8.

Thereafter, the focusing means 121 shown in FIG. 6 is moved in the +Y direction to a position directly above the next street S adjacent to the predetermined street S where the laser processed groove M has been formed as mentioned above. Thereafter, the focusing means 121 is positioned with respect to the center line of this next street S in the Y direction in a manner similar to that mentioned above. Thereafter, the laser beam (wide beam) is applied to the wafer W as feeding the wafer W in the +X direction (backward direction) to thereby similarly form a laser processed groove M along this next street S. Thus, this laser processing is similarly performed along all of the other streets S extending in the first direction to similarly form a laser processed groove M along each street S extending in the first direction. Thereafter, the chuck table 11 is rotated 90 degrees to similarly perform this laser processing along all of the other streets S extending in the second direction perpendicular to the first direction to similarly form a laser processed groove M along each street S extending in the second direction. As a result, the wiring layer W2 is removed along all of the crossing streets S extending in the first and second directions to form the laser processed groove M along each street S.

(3) Dry Etching Step

After performing the laser processed groove forming step, a dry etching step is performed to dry-etch the laser processed groove M along each street S shown in FIG. 8. In the dry etching step, the silicon substrate W1 exposed to the laser processed groove M along each street S is etched. In particular, it is important to etch the side walls of the laser processed groove M along each street S in an area formed by the silicon substrate W1.

Figure 9:
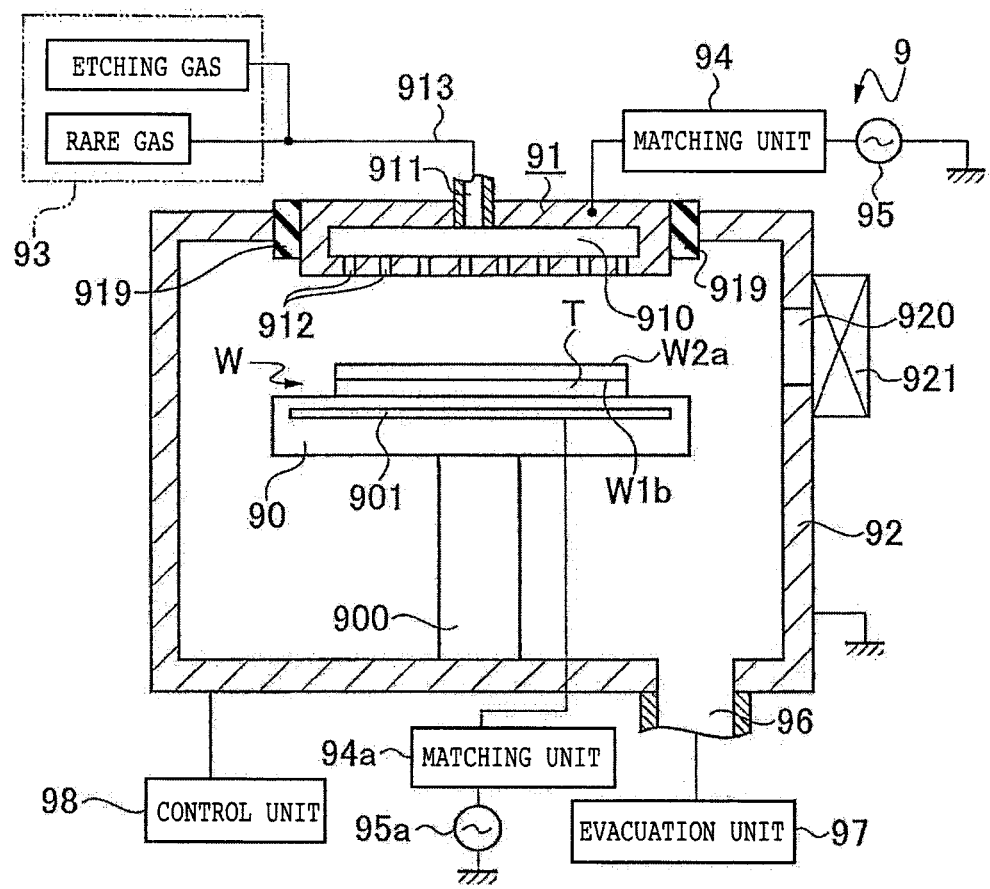
FIG. 9 is a schematic sectional view of a plasma etching apparatus to be used in performing a dry etching step.
Figure 10:
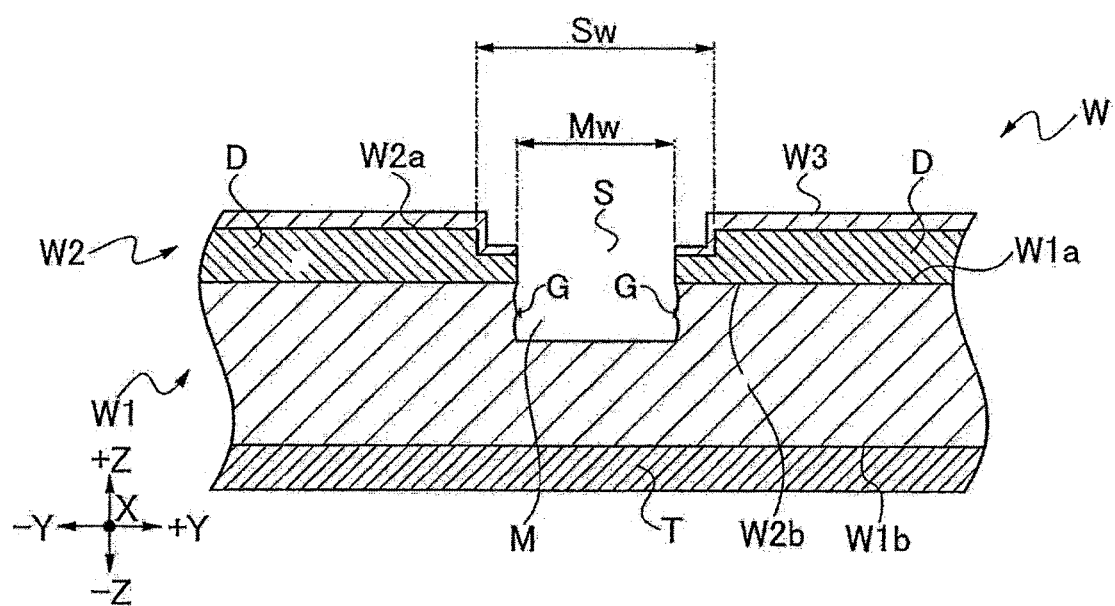
FIG. 10 is an enlarged sectional view of an essential part of the wafer processed by the dry etching step.

The dry etching step in this preferred embodiment is performed by using a plasma etching apparatus 9 shown in FIG. 9. The plasma etching apparatus 9 includes an electrostatic chuck (ESC) 90 for holding the wafer W, a gas discharge head 91 for discharging a gas, and a chamber 92 accommodating the electrostatic chuck 90 and the gas discharge head 91.

The electrostatic chuck 90 is supported from its lower side by a support member 900. An electrode 901 is provided inside the electrostatic chuck 90. The electrode 901 is connected through a matching unit 94a to a bias radio frequency (RF) source 95a. The bias RF source 95a functions to apply a direct current (DC) voltage to the electrode 901, thereby producing an electrostatic holding force on the upper surface (holding surface) of the electrostatic chuck 90. Thus, the wafer W can be held on the electrostatic chuck 90 by the electrostatic holding force.

The gas discharge head 91 is vertically movably supported through a bearing 919 to the upper portion of the chamber 92. A gas diffusion space 910 is defined inside the gas discharge head 91. A gas inlet opening 911 is in communication with the upper portion of the gas diffusion space 910, and a plurality of gas discharge openings 912 are in communication with the lower portion of the gas diffusion space 910. The lower ends of the gas discharge openings 912 are directed toward the electrostatic chuck 90.

A gas supply unit 93 is connected through a gas pipe 913 to the gas inlet opening 911. The gas supply unit 93 includes a portion of storing an etching gas and a portion of storing a rare gas. An RF source 95 is connected through a matching unit 94 to the gas discharge head 91. An RF power is supplied from the RF source 95 through the matching unit 94 to the gas discharge head 91, thereby generating a plasma of the gas discharged from the gas discharge openings 912.

An evacuation pipe 96 is connected to the lower portion of the chamber 92, and an evacuation unit 97 is connected to the evacuation pipe 96. By operating the evacuation unit 97, the pressure in the chamber 92 can be reduced to a predetermined vacuum. The side portion of the chamber 92 is provided with a load/unload opening 920 for loading and unloading the wafer W and a gate valve 921 for closing the load/unload opening 920. The plasma etching apparatus 9 includes a control unit 98 for controlling various conditions including the discharge amount and time for each gas and the RF power to be applied.

In performing the dry etching step, the gate valve 921 is opened to load the wafer W from the load/unload opening 920. Thereafter, the wafer W is placed on the electrostatic chuck 90 in the condition where the adhesive tape T attached to the wafer W is oriented downward. In this condition, a DC voltage is applied from the RF source 95a to the electrode 901 to produce an electrostatic holding force on the upper surface (holding surface) of the electrostatic chuck 90. After closing the gate valve 921, the chamber 92 is evacuated by the evacuation unit 97 to thereby reduce the pressure in the chamber 92 to 0.10 Pa to 0.15 Pa, for example. Further, the etching gas stored in the gas supply unit 93 is supplied through the gas pipe 913 and the gas inlet opening 911 to the gas diffusion space 910 and then discharged from the gas discharge openings 912. In FIG. 9, the ring frame F is not shown.

As described above, the etching gas is introduced into the chamber 92. Further, the temperature of the electrostatic chuck 90 is set to 70° C. or lower, which is a temperature where no gas is generated from the adhesive tape T. Further, RF power is applied from the RF source 95 to the gas discharge head 91, thereby producing an RF field between the gas discharge head 91 and the electrostatic chuck 90 to generate the plasma of the etching gas.

A fluorine-based gas such as $SF_6$, $CF_4$, $C_2F_6$, and $C_2F_4$ may be used as the etching gas. Further, a rare gas such as Ar and He may be used as a plasma assisting gas. In the case that the diameter of the wafer W is 300 mm, RF power having a power of 3 kW and a frequency of 13.56 MHz may be applied. In this case, a rare gas such as Ar functions to assist the generation of the plasma of the etching gas. The supply of the rare gas into the chamber 92 may be conducted before the supply of the etching gas.

In the case that the diameter of the wafer W is 300 mm, this etching step may be performed under the following specific condition A. Of the debris G including Cu as generated in the laser processed groove forming step shown in FIG. 8, the debris G adhering to the side walls of the silicon substrate W1 exposed to each laser processed groove M is essentially removed by this etching step. When the debris G adhering to the side walls of the silicon substrate W1 is grown, this debris G may most possibly come into contact with the wiring layer W2 including Cu. In the etching step, the debris G itself adhering to the side walls of the silicon substrate W1 is not etched, but the side walls of the silicon substrate W1 are slightly etched in the lateral direction of each laser processed groove M (in the Y direction as viewed in FIG. 8), because the debris G adheres to the side walls of the silicon substrate W1 in a slight contact area. Accordingly, the debris G can be removed from the side walls of the silicon substrate W1 by performing the etching step. In other words, the isotropic shape of each laser processed groove M by the dry etching is maintained (i.e., the etching rate in the Y direction is equal to the etching rate in the Z direction), and the debris G adhering to the side walls of the silicon substrate W1 can be essentially removed by the etching in the lateral direction (Y direction) in the isotropic etching. Alternatively, the side walls of the silicon substrate W1 are etched to such an extent that the debris G is removably bonded to the side walls of the silicon substrate W1 in a slight contact area. Even in such a case that the debris G is not yet removed, there is no possibility that the debris G may react with the silicon substrate W1.

(Condition A)
  Etching gas: $SF_6$ gas
  Plasma assisting gas: Ar gas
  Etching gas supply rate: 1500 cc/minute
  Plasma assisting gas supply rate: 1000 cc/minute
  RF power: 3 kW The protective film W3 for protecting the wiring layer W2 forming each device D is hardly etched by the etching gas, but only the area corresponding to each laser processed groove M formed on the front side W2a of the wafer W is isotropically etched by the etching gas. More specifically, the side walls (end surfaces) of the wiring layer W2 including Cu exposed to each laser processed groove M are also etched. The side walls of the silicon substrate W1 exposed to each laser processed groove M are laterally etched and the bottom of each laser processed groove M is also etched downward. As a result, the side walls of the silicon substrate W1 exposed to each laser processed groove M are essentially etched to obtain a condition that the debris G can be easily removed.

After ending the dry etching, the application of the RF power is stopped and the wafer W is unloaded from the load/unload opening 920 shown in FIG. 9. In the case that the protective film forming step is performed before performing (1) the dry etching step as in this preferred embodiment, the protective film W3 may be removed from the front side W2a of the wafer W after performing the dry etching step. Preferably, a water-soluble resin is used as the material of the protective film W3, so as to facilitate the formation and removal of the protective film W3. That is, after performing the dry etching step, the wafer W is cleaned with water, so that the protective film W3 formed of a water-soluble resin can be easily removed.

(4) Cutting Step

Figure 11:
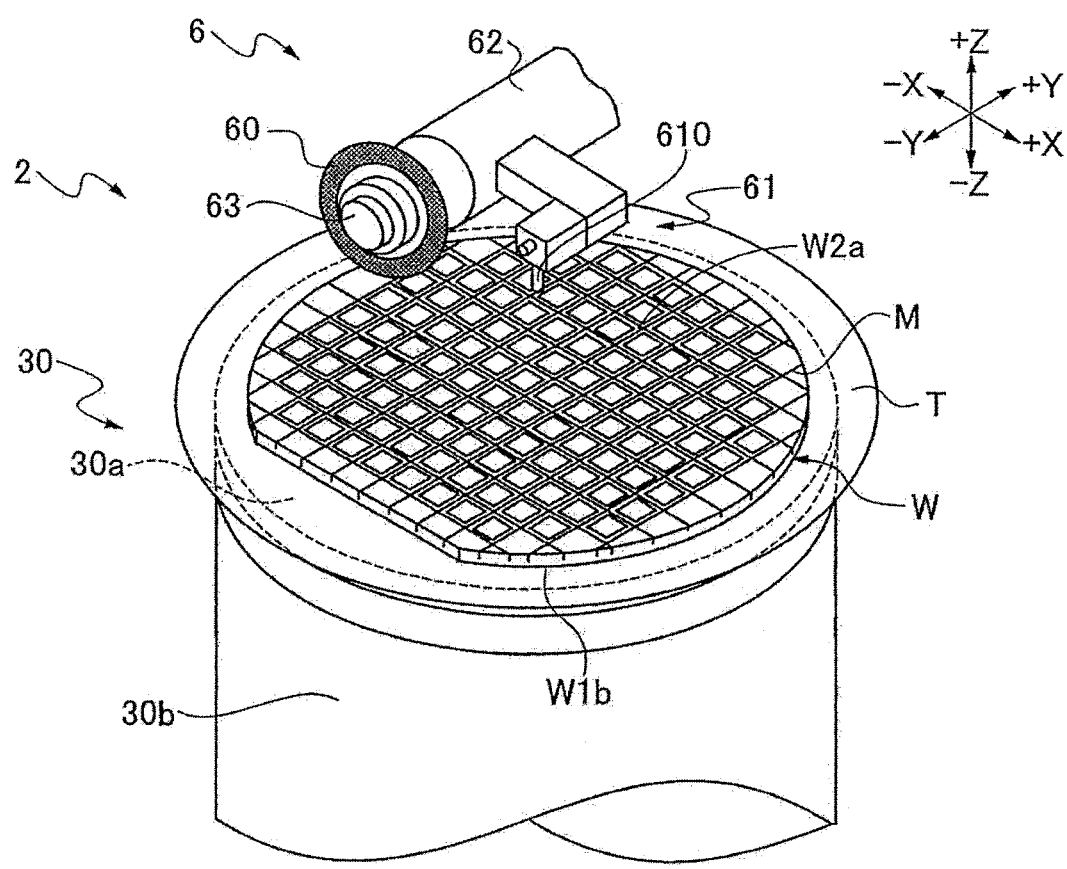
FIG. 11 is a perspective view showing a condition that the wafer is cut by a cutting apparatus in a cutting step.

After performing the dry etching step, a cutting step is performed in such a manner that a cutting blade 60 having a thickness smaller than the width Mw of each laser processed groove M is used to fully cut the wafer W along each laser processed groove M as shown in FIG. 11. In the case that the protective film W3 is formed of a water-soluble resin, the protective film W3 can be dissolved in a cutting water used in this cutting step, thus being removed from the wafer W.

FIG. 11 shows a cutting apparatus 2 to be used in this cutting step. The cutting apparatus 2 essentially includes a chuck table 30 for holding the wafer W, cutting means 6 having the cutting blade 60 for cutting the wafer W held on the chuck table 30, and alignment means 61 for detecting each laser processed groove M along which the cutting blade 60 is relatively moved to cut the wafer W held on the chuck table 30. The alignment means 61 includes imaging means 610 for imaging the front side W2a of the wafer W. The alignment means 61 can detect each laser processed groove M according to an image obtained by the imaging means 610. The alignment means 61 and the cutting means 6 are united together, and they are movable together in the Y direction and the Z direction. The chuck table 30 has a holding surface 30a for holding the wafer W thereon under suction. The chuck table 30 is rotatably supported by rotating means 30b provided below the chuck table 30. Further, the chuck table 30 is movable in the X direction by work feeding means (X moving means) (not shown).

Figure 12:
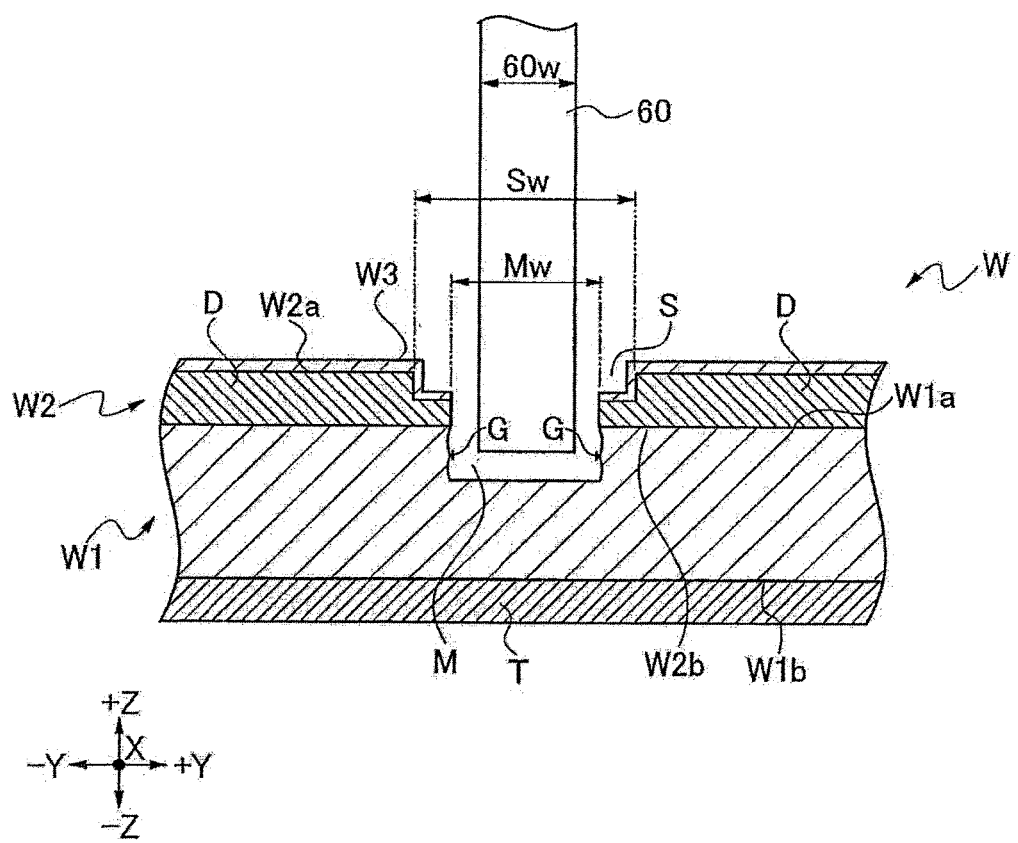
FIG. 12 is an enlarged sectional view showing a positional relation between a cutting blade and the laser processed groove of the wafer in the cutting step.

The cutting means 6 further includes a spindle housing 62 and a spindle 63 rotatably stored in the spindle housing 62. The spindle 63 has a rotational axis extending in the direction (Y direction) perpendicular to the X direction in a horizontal plane. The front end portion of the spindle 63 projects from the spindle housing 62 in the −Y direction. The cutting blade 60 is coaxially fixed to the front end portion of the spindle 63, so that the cutting blade 60 is rotatable together with the spindle 63. The spindle 63 is rotationally driven by a motor (not shown) to thereby allow high-speed rotation of the cutting blade 60. As shown in FIG. 12, the cutting blade 60 has a thickness 60w smaller than the width Mw of each laser processed groove M.

In the cutting step, the wafer W supported through the adhesive tape T to the ring frame F (not shown in FIG. 11) is positioned in such a manner that the adhesive tape T attached to the back side W1b of the wafer W is opposed to the holding surface 30a of the chuck table 30. Thereafter, the wafer W is placed on the chuck table 30 in the condition where the adhesive tape T is in contact with the holding surface 30a of the chuck table 30. In this condition, suction means (not shown) connected to the chuck table 30 is operated to hold the wafer W through the adhesive tape T on the chuck table 30 under suction. Although not shown, a plurality of clamps are provided on the outer circumference of the chuck table 30, and the ring frame F supporting the wafer W through the adhesive tape T is fixed by the clamps.

Thereafter, the X moving means (not shown) is operated to move the chuck table 30 holding the wafer W in the −X direction, and the imaging means 610 is operated to image the front side W2a of the wafer W, thereby detecting the position of each laser processed groove M to be cut. In association with the detection of each laser processed groove M, the cutting means 6 is moved in the Y direction by indexing means (Y moving means) (not shown) to thereby position the cutting blade 60 in the Y direction with respect to a predetermined one of the laser processed grooves M extending in the first direction. This positioning of the cutting blade 60 is performed so that the center of the thickness 60w of the cutting blade 60 coincides with the center of the width Mw of the predetermined laser processed groove M.

Thereafter, the X moving means (not shown) is operated again to move the chuck table 30 holding the wafer W in the −X direction, and the cutting means 6 is moved (lowered) in the −Z direction by cutter feeding means (Z moving means) (not shown). Further, the spindle 63 is rotated at a high speed by the motor (not shown) to thereby rotate the cutting blade 60 fixed to the spindle 63. Accordingly, the cutting blade 60 being rotated at a high speed is lowered to cut into the wafer W, so that the bottom of the predetermined laser processed groove M is cut by the cutting blade 60 so as to fully cut the wafer W.

When the wafer W is fed to reach a predetermined position in the X direction where the cutting of the predetermined laser processed groove M is to be stopped, the feeding of the wafer W by the X moving means is once stopped. Then, the Z moving means is operated to raise the cutting blade 60 away from the wafer W. Thereafter, the X moving means is operated again to move the wafer W in the +X direction until the wafer W is returned to the original position. Thereafter, the Y moving means is operated to index the cutting blade 60 in the Y direction by the pitch of the laser processed grooves M. Thereafter, the cutting operation is similarly performed along the next laser processed groove M adjacent to the predetermined laser processed groove M. In this manner, the cutting operation is similarly performed along all of the other laser processed grooves M extending in the first direction to thereby fully cut the wafer W along each laser processed groove M extending in the first direction. Thereafter, the chuck table 30 holding the wafer W is rotated 90 degrees by the rotating means 30b to similarly perform the cutting operation along all of the other laser processed grooves M extending in the second direction perpendicular to the first direction to thereby fully cut the wafer W along each laser processed groove M extending in the second direction. As a result, the wafer W is fully cut along all of the crossing laser processed grooves M extending in the first and second directions, thereby obtaining individual device chips each corresponding to the devices D.

As described above, the wafer dividing method according to the present invention is a method of dividing the wafer W having the wiring layer W2 including Cu on the front side W2a, the front side W2a of the wafer W being partitioned by the crossing streets S to define a plurality of separate regions where the plural devices D are formed. The wafer dividing method includes the laser processed groove forming step of applying a laser beam having an absorption wavelength to the wafer W, to the wiring layer W2 along each street S to thereby remove the wiring layer W2 along each street S and form the laser processed groove M along each street S, the cutting step of using the cutting blade 60 having a thickness smaller than the width Mw of each laser processed groove M to fully cut the wafer W along each laser processed groove M after performing the laser processed groove forming step, and the dry etching step of dry-etching at least each laser processed groove M after performing the laser processed groove forming step (before performing the cutting step in this preferred embodiment). Accordingly, the silicon substrate W1 exposed to each laser processed groove M is dry-etched in an area where the debris G including Cu adheres, thereby removing the debris G including Cu from the silicon substrate W1. As a result, the growth of the debris G including Cu in each laser processed groove M can be suppressed to thereby eliminate the possibility that the debris G may come into contact with the wiring layer W2 of each device chip obtained by dividing the wafer W.

The wafer dividing method according to the present invention is not limited to the above preferred embodiment. Further, the size, shape, etc. of each component of the spin coater 40, the laser processing apparatus 1, the plasma etching apparatus 9, and the cutting apparatus 2 shown in the attached drawings are merely illustrative and may be suitably changed within the scope where the effect of the present invention can be exhibited.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer dividing method for dividing a wafer having a wiring layer including Cu on a front side, the front side of said wafer being partitioned by a plurality of crossing division lines to define a plurality of separate regions where a plurality of devices are formed, said wafer dividing method comprising:

a protective film forming step of forming a protective film for protecting the front side of said wafer, said protective film being formed of a water-soluble resin;

a laser processed groove forming step of applying a laser beam having an absorption wavelength to said wafer, to said wiring layer along each division line to thereby remove said wiring layer along each division line and form a laser processed groove along each division line after performing said protective film forming step, wherein the laser processed groove extends beyond the wiring layer and into a substrate of the wafer, wherein the substrate of the wafer comprises a silicon substrate, and further wherein a focal point of the laser beam is set at a vertical position slightly below an upper surface of the silicon substrate;

a dry etching step of dry-etching side walls of each laser processed groove to remove debris including Cu adhered to the side walls of the laser processed groove after performing said laser processed groove forming step;

a protective film removing step of supplying water to said protective film formed of the water-soluble resin; and a cutting step of using a cutting blade having a thickness smaller than the width of each laser processed groove and supplying cutting water to fully cut said wafer along each laser processed groove after performing said laser processed groove forming step, wherein said dry etching step is carried out by introducing into an etching chamber an etching gas selected from a group consisting of $SF_6$, $CF_4$, $C_2F_6$ and $C_2F_4$ together with rare gas as a plasma assisting gas; and wherein said protective film removing step is carried out simultaneously with said cutting step and said protective film is removed by said cutting water; and wherein the laser processed groove forming step comprises:

a first sub-step of forming a pair of first laser processed grooves within each division line, thereby leaving a wiring layer between said pair of first laser processed grooves, wherein each of the first laser processed grooves is of a first width and further wherein the first laser processed grooves each extend beyond the wiring layer and into the substrate of the wafer; and a second sub-step of forming a second laser processed groove to remove the wiring layer between said pair of first laser processed grooves, wherein the second laser processed groove is of a width that is greater than two times the first width.

2. The method of claim 1, wherein the dry-etching step is performed under the following conditions:

Etching gas: $SF_6$ gas
Plasma assisting gas: Ar gas
Etching gas supply rate: 1500 cc/minute
Plasma assisting gas supply rate: 1000 cc/minute
RF power: 3 kW.

3. The method of claim 1, wherein the width of the focused spot diameter of the laser beam associated with the second sub-step of forming a second laser processed groove is wider than the width of the focused spot diameter of the laser beam associated with the first sub-step of forming a pair of first laser processed grooves.

* * * * *